(12) United States Patent
Fournier et al.

(10) Patent No.: US 7,994,034 B2
(45) Date of Patent: Aug. 9, 2011

(54) TEMPERATURE AND PRESSURE CONTROL METHODS TO FILL FEATURES WITH PROGRAMMABLE RESISTANCE AND SWITCHING DEVICES

(75) Inventors: Jeff Fournier, Livonia, MI (US); Wolodymyr Czubatyj, Warren, MI (US); Tyler Lowrey, Rochester Hills, MI (US)

(73) Assignee: Ovonyx, Inc., Troy, MI (US)

( * ) Notice: Subject to any disclaimer, the term of this patent is extended or adjusted under 35 U.S.C. 154(b) by 410 days.

(21) Appl. No.: 12/075,180

(22) Filed: Mar. 10, 2008

(65) Prior Publication Data
US 2009/0227092 A1 Sep. 10, 2009

(51) Int. Cl.
*H01L 21/20* (2006.01)
(52) U.S. Cl. ........ 438/584; 438/627; 438/632; 438/643; 438/653; 438/660; 257/E21.303; 257/E21.588
(58) Field of Classification Search .................. 438/632, 438/646, 661
See application file for complete search history.

(56) References Cited

U.S. PATENT DOCUMENTS

| | | | | |
|---|---|---|---|---|
| 5,731,245 A | * | 3/1998 | Joshi et al. | 438/705 |
| 6,114,098 A | * | 9/2000 | Appelt et al. | 430/315 |
| 2006/0024429 A1 | * | 2/2006 | Horii | 427/97.7 |

* cited by examiner

*Primary Examiner* — N Drew Richards
*Assistant Examiner* — Kyoung Lee
(74) *Attorney, Agent, or Firm* — Kevin L. Bray (57) ABSTRACT

A programmable resistance, chalcogenide, switching or phase-change material device includes a substrate with a plurality of stacked layers including a conducting bottom electrode layer, an insulative layer having an opening formed therein, an active material layer deposited over both the insulative layer, within the opening, and over selected portions of the bottom electrode, and a top electrode layer deposited over the active material layer. The device uses temperature and pressure control methods to increase surface mobility in an active material layer, thus providing complete coverage or fill of the openings in the insulative layer, selected exposed portions of the bottom electrode layer, and the insulative layer.

19 Claims, 8 Drawing Sheets

PRIOR ART

FIG. 1

PRIOR ART

TEMPERATURE AND PRESSURE CONTROL METHODS TO FILL FEATURES WITH PROGRAMMABLE RESISTANCE AND SWITCHING DEVICES

FIELD OF INVENTION

This invention relates generally to uniform and complete filling of openings within programmable resistance and switching devices having one or more electrical contacts. More particularly, this invention relates to forming programmable resistance and switching device structures with active materials that uniformly cover intermediate layers and openings within the device. Most particularly, this invention relates to temperature and pressure control methods used to form programmable resistance and switching devices with uniform layers and openings having reduced structural irregularities, improved filling, uniform film thickness and improved device characteristics.

BACKGROUND OF THE INVENTION

Programmable resistance materials and fast switching materials are two classes of promising active materials for next-generation electronic storage, computing and signal transfer devices. A programmable resistance material possesses two or more states that differ in electrical resistance. The material can be programmed back and forth between the states by providing energy to the material to induce an internal transformation of the material that manifests itself as a change in resistance of the material. The different resistance states can be used to store or process data and the different resistance values of the resistance states can serve as identifying indicia of the states.

Fast switching materials are not based on programmable resistance change. They are, however, capable of being switched between a relatively resistive state, the quiescent low conduction state, and the highly conductive state. Application of an energy signal, typically an electrical energy signal, induces this change from the relatively resistive state to the relatively conductive state. The relatively conductive state persists for so long as a certain level of energy signal continues to be applied. Once the energy signal is removed, the switching material relaxes back to its quiescent state. Devices that incorporate switching materials are useful as voltage clamping devices, surge suppression devices, signal routing devices, and access devices.

Phase change materials are a promising class of programmable resistance materials. A phase change material is a material that is capable of undergoing a transformation, preferably reversible, between two or more distinct structural states. In a common embodiment, a phase change material is reversibly transformable between a crystalline state and an amorphous state. In the crystalline state, the phase change material has low resistivity; while in the amorphous state, it has high resistivity. The distinct structural states of a phase change material may be distinguished on the basis of, for example, crystal structure, atomic arrangement, order or disorder, fractional crystallinity, relative proportions of two or more different structural states, a physical (e.g. electrical, optical, magnetic, mechanical) or chemical property etc. Reversibility of the transformations between structural states permits reuse of the material over multiple cycles of operation.

Typically, a programmable resistance material or switching device is formed by placing an active material, such as a phase change material, between two electrodes. Operation of the device is effected by providing an electrical signal between the two electrodes and across the active material. Programmable resistance materials may be used as the active material of a memory device. Write operations in a memory device, also called programming operations, which apply electric pulses to the memory device, and read operations, which measure the resistance of the memory device, are performed by providing current or voltage signals across the two electrodes. The transformation between the relatively resistive state and relatively conductive state of a switching material is similarly induced by providing a current or voltage signal between two electrodes in contact with the switching material. One of the significant practical challenges that the programmable resistance memory and switching devices face is to reduce the contact area of one or more electrodes contacting the chalcogenide material. By reducing the contact area, the energy required to program a memory device or switch a switching device can be reduced and more efficient devices can be achieved.

Fabrication of semiconductor devices such as logic and memory devices typically includes a number of processes that may be used to form various features and multiple levels or layers of semiconductor devices on a surface of a semiconductor wafer or another appropriate substrate.

Physical (PVD) and chemical (CVD) vapor deposition methods, and also the deposition of conductive coatings through various decomposition processes of gaseous, liquid or solid precursors may be used in the formation of semiconductor devices.

Additionally, lithography is a process used in the formation of semiconductor devices that typically involves transferring a pattern to a resist arranged on a surface of a semiconductor wafer. Lithography is commonly used to define small-scale features of semiconductor devices and often sets a limit on the goal of device miniaturization.

Additional examples of semiconductor fabrication processes include chemical-mechanical polishing, etching, deposition, ion implantation, plating, and cleaning. Semiconductor devices are significantly smaller than a typical semiconductor wafer or substrate, and an array of semiconductor devices may be formed on a semiconductor wafer. After processing is complete, the semiconductor wafer may be separated into individual semiconductor devices.

In semiconductor device fabrication, it is desirable to reduce the length scale or feature size of devices as much as possible so that a larger number of devices can be formed on a given substrate area. As the feature size of devices is minimized, however, processing of the devices becomes more difficult. Small scale features become more difficult to define as the lithographic limit of resolution is reached and features that are defined become more difficult to process.

A common step in processing involves depositing a layer and forming an opening in it. Openings such as channels, trenches, holes, vias, pores or depressions in layers are commonly employed to permit interconnections between devices or layers of a structure. Typically, the opening is formed by lithography or etching and is subsequently filled with another material. As the dimension or length scale of an opening decreases upon miniaturization, it becomes increasingly difficult to satisfactorily fill the opening with another material.

Techniques such as physical vapor deposition (PVD) or sputtering fail to provide dense or complete filling of openings when the dimensions of the opening are reduced below a critical size. Instead of providing a dense, uniform filling, these techniques increasingly incompletely fill openings as the dimension of the opening decreases while the depth stays the same, thus increasing the aspect ratio. The deposited layer of material includes gaps, pores, or other unfilled regions. The packing density of material formed in the opening may vary in the depth or lateral dimensions of the opening.

Lack of structural uniformity in the filling of openings compromises device functionality as variations occur from device-to-device across an array of devices on a substrate. In addition, less than optimal performance is achieved for each device due to the defective nature of the deposited material. Imperfections in filling openings become especially pronounced as the aspect ratio (ratio of the dimension normal to the substrate to the dimension parallel to the substrate) of the opening increases. Deep, narrow channels, for example, are more difficult to uniformly fill than channels that are shallow and wide. With deep, narrow features, sputtering and other physical deposition techniques are oftentimes unable to deliver sufficient material uniformly to underlying layers, to the bottom of the feature or to completely fill an opening within the device. Instead, a layer of material is formed over or only near the top of the feature and the lower part of the feature is blocked and remains largely unfilled.

In the fabrication of non-volatile memory (and other) devices based on active materials, it is desirable to have completely and evenly filled openings, where the bottom of the opening usually defines the lower contact and the top contact or electrode is located above the active material. Poor opening filling can lead to uncontrolled thickness variation of the active material, leading to device shunting, premature device failure or poor device characteristics.

Conformality of deposition is another processing difficulty that becomes exacerbated as feature size decreases. Fabrication of semiconductor devices generally involves forming a stack of layers, where the individual layers may differ in dimensions (lateral to or normal to the substrate) and compositions. The process of fabricating a semiconductor device generally involves sequential deposition of one layer upon a lower (previously formed) layer. Optimal device performance requires conformality of later formed layers with earlier formed layers. Each layer in a stack must conform to the shape and contours of the layer in the stack upon which it is formed. Smooth and uniform coverage is desired.

In addition to difficulties with achieving uniform filling, openings also present complications for achieving conformal deposition that become more pronounced as size of the opening decreases. The boundary or perimeter of an opening is frequently defined by an edge, step, or other relatively discontinuous feature. The shape of an opening is generally defined by a sidewall or perimeter boundary and a lower surface or bottom boundary. A trench opening, for example, is defined by generally vertical sidewalls and a bottom surface that is generally parallel to the substrate.

Existing devices are made on low aspect ratio openings and the sides of the opening are tapered, to allow better filling.

When fabricating semiconductor devices, it is often necessary to first form a layer with an opening and to subsequently deposit another layer over this layer. Conformality requires that the subsequent layer faithfully conform to the shape and texture of the underlying layer having the opening. The subsequent layer must deposit uniformly over both the portion of the underlying layer in which the opening has not been formed as well as over the opening itself. Conformality over the opening requires uniform coverage of the edges or steps that form the boundary of the opening. Achieving conformality over discontinuous features becomes increasingly difficult as the feature size of the opening decreases or the aspect ratio of the opening increases.

Fabrication of programmable resistance and switching devices often includes a step of forming an opening in a dielectric layer and filling the opening with a conductive material to form an electrical contact. Miniaturization of programmable resistance and switching devices requires methods for reducing the dimensions of the electrical contacts. Contacts with small dimensions are beneficial because the energy required to operate programmable resistance and switching devices decreases with decreasing contact size. Accordingly, it is desirable to develop techniques for forming and filling openings with small dimensions without suffering from the imperfections in filling and conformality associated with standard prior art techniques such as sputtering, or physical vapor deposition. Ideally, the techniques would enable the fabrication of electrical contacts for programmable resistance and switching devices having dimensions near, at or below the lithographic limit.

Figure 1:
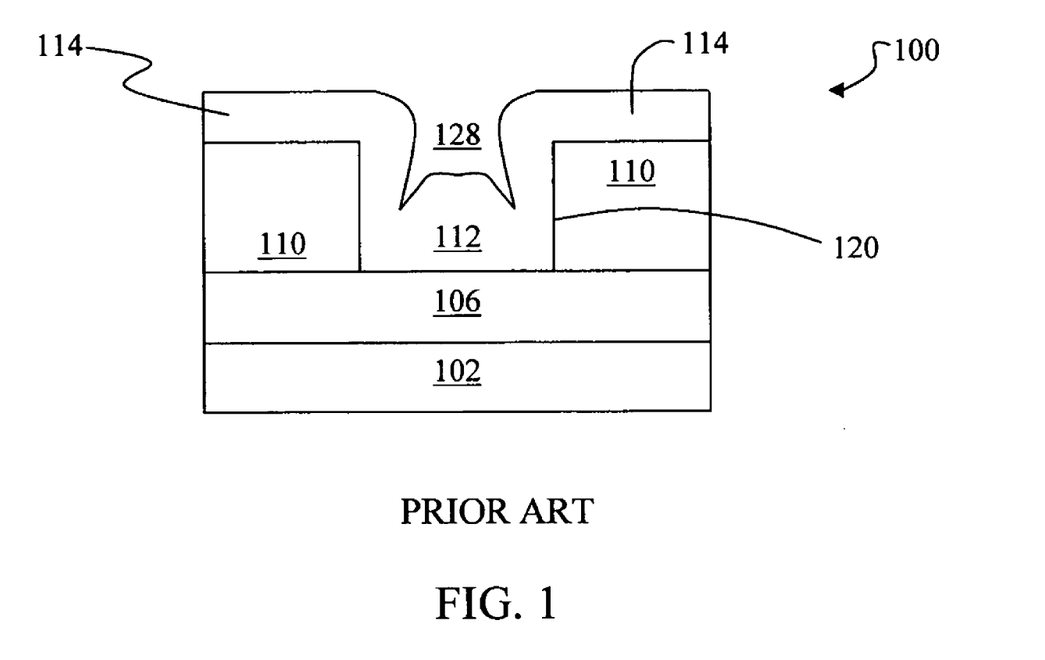
FIG. 1 is a schematic depiction of a conventional two-terminal electronic device having defects in an upper layer and in opening region of the two terminal device.

Referring to the drawings, FIG. 1 depicts a representative structure of a phase change material device that illustrates the nature of imperfections that may form in an opening of the electrical device when an active material layer is deposited via a standard deposition process such as sputtering or physical vapor deposition. A conductive bottom electrode layer 106 is formed over a substrate 102. An insulative layer 110 having an opening 128 having perpendicular sidewalls 120 with respect to the substrate formed therein is then formed over the conductive bottom electrode layer 106. Active material layer 114 is deposited over the insulative layer 110 in the opening 128 of insulative layer 110 using a sputtering or physical vapor deposition process. The active material layer 114 includes imperfections in the form of non-uniform thickness and non-conformal region 112 within the opening 128. The imperfections detract from device performance and reliability. The prevalence of the imperfections increases as the aspect ratio of the opening increases.

Figure 2:
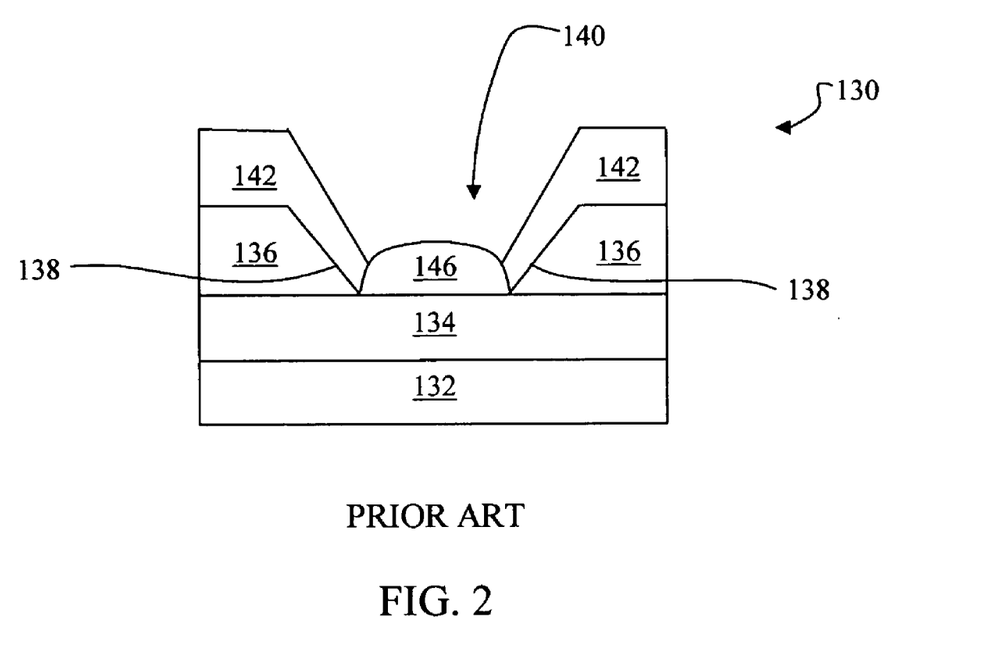
FIG. 2 is a schematic depiction of a conventional two-terminal electronic device having defects in an upper layer and in an opening region of the two terminal device.

Referring to the drawings, FIG. 2 depicts another representative structure 130 of a phase change material device that illustrates the nature of imperfections that may form in an opening of the electrical device when an active material layer is deposited via sputtering or physical vapor deposition. A conductive bottom electrode layer 134 is formed over a substrate 132. An insulative layer 136 having an opening 140 formed therein with tapered or sloped sidewalls 138 is then formed over conductive bottom electrode layer 134. Active material layer 142 is deposited over the insulative layer 136 in the opening 140 of insulative layer 136 using a sputtering or physical vapor deposition process. The active material layer 142 includes imperfections in the form of non-uniform thickness and non-conformal region 146. While coverage of the active material layer 142 for the device 130 with the sloped sidewalls is slightly better than the active material layer 114 of the device 100, the imperfections detract from device performance and reliability. The prevalence of the imperfections increases as aspect ratio of the opening increases.

As illustrated in prior art FIGS. 1-2, the openings are typically very difficult to fill by standard PVD sputtering, evaporation, or other directional deposition processes without forming structural irregularities.

Chemical Vapor Deposition (CVD) is one method available in the prior art for filling openings that can potentially remain effective as the feature size of the opening decreases. The molecular dimensions of the gas phase precursors used in CVD allow the precursors to enter small dimensional openings, where they subsequently react to form a relatively uniform layer. Although CVD in principle is a viable strategy for filling lithographic or sublithographic openings in programmable resistance and switching devices, the technique is limited in practice because of the unavailability of gas phase precursors for a variety of desirable programmable resistance, fast switching, and other contact materials. In addition, the reaction conditions (e.g. high temperatures or plasma conditions) needed to react the precursors may damage other layers in the device structure. Also, CVD deposition methods often require complex chemistries which result in unwanted additional atomic elements being incorporated at undesirably high levels in the deposited film. There is a need, therefore, for alternative methods of filling openings having small dimensions with active material.

To address these issues, conformal deposition and increasing surface mobility within the active layer of the device may be used to reduce structural irregularities in electronic devices, including lithographic and sublithographic structures, and to uniformly fill openings with one or more desired materials thereby increasing the performance, reliability, design flexibility, and quality of the resulting devices.

SUMMARY OF THE INVENTION

The instant invention provides electronic devices having logic, memory, switching, or processing functionality based on programmable resistance materials, switching materials or other active materials and methods of fabricating same.

In accordance with one embodiment of the instant invention, a programmable resistance or switching device includes a substrate with a plurality of stacked layers including a conducting bottom electrode layer, an insulative layer having an opening formed therein, and an active material layer deposited over both the insulative layer and the exposed bottom electrode layer.

In accordance with one embodiment of the instant invention, a programmable resistance material or switching material deposition is performed using conventional deposition processes in addition to increasing surface mobility within the active material layer to uniformly cover the insulative layer and to fill the insulative layer opening to the conductive bottom electrode layer with an active material layer. Uniformity in covering the insulative layer with the active material layer and uniformity in filling the active material within the opening reduces structural irregularities within the opening thereby increasing material density, reducing thickness variations in the active material layer, reducing device shunting and early failure of the device, and improving device characteristics.

For a better understanding of the instant invention, together with other and further illustrative objects thereof, reference is made to the following description, taken in conjunction with the accompanying drawings and claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATED EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a novel electronic device including conformally filling openings within an insulating material in accordance with the instant invention are illustrated in FIGS. 1 through 9. Throughout the various views and illustrative embodiments of the instant invention, like reference numbers are used to designate like elements.

The instant invention improves uniformity and conformal coverage of a conventional deposition process and helps prevent the problem of structural irregularities occurring during deposition processes including physical vapor sputtering deposition, especially for high aspect ratio openings.

Figure 3:
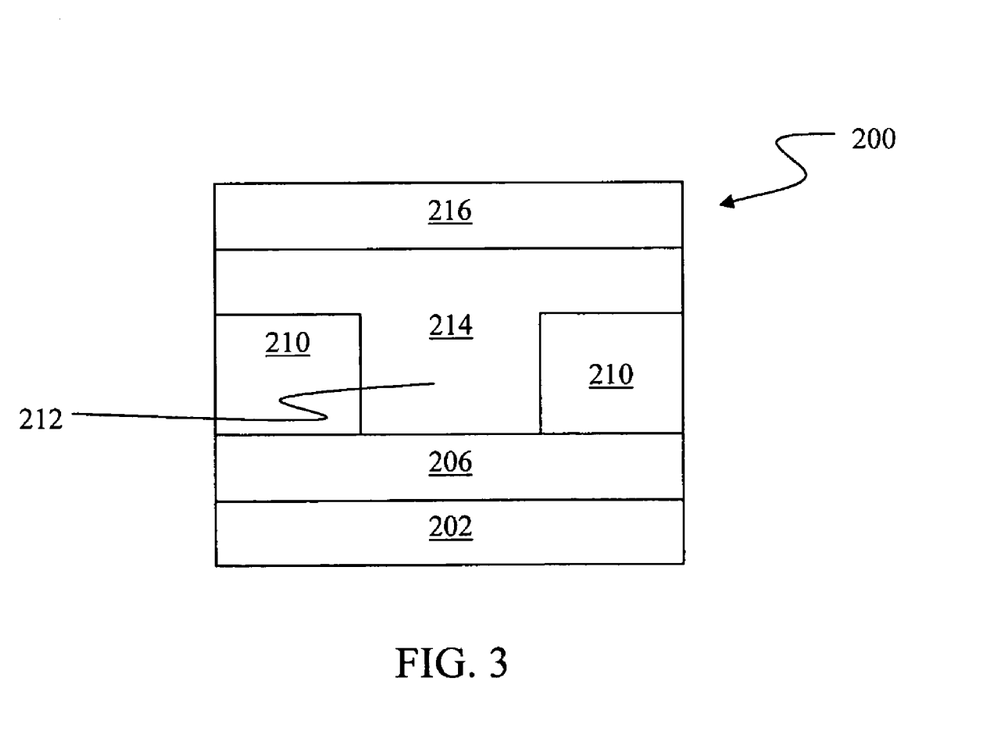
FIG. 3 illustrates a composite structure of an electronic device with an active material layer, such device having a conductive bottom electrode layer, an insulative layer with an opening, and active material that more uniformly fills an opening in the insulative layer through a temperature and pressure control filling process.

FIG. 3 illustrates a composite structure of an electronic semiconductor device 200

The process of the instant invention may be used to form a 2- or a 3-terminal structure, wherein photolithography or e-beam lithography can be used to define the outer boundaries of the material device.

The main part of the composite structure 200 is formed as stacked layers on a substrate 202 as is illustrated in FIG. 3. The substrate 202 may be a silicon substrate or a substrate comprising other semiconductor materials and may include access devices, transistors, diodes, power devices, interconnect lines, or other electronic circuitry. The stacked layers comprise a conductive bottom electrode 206 formed on a substrate 202, an insulative layer 210 having an opening 212 formed therein thereby exposing a portion of the bottom electrode layer 206, an active material layer 214, and a top electrode layer 216 is formed over the active material layer 214.

Figure 4:
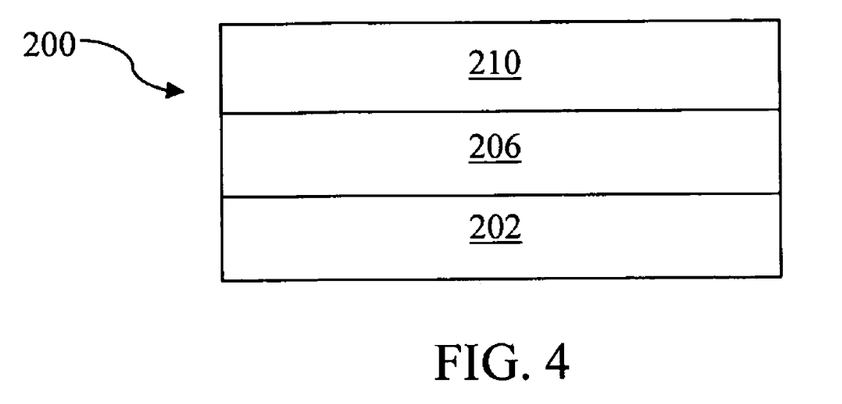
FIG. 4 illustrates a partial cross-sectional view of an electronic device with an active material layer including a substrate and a first stacked conductive lower contact layer, and a second stacked insulative layer on the deposited conductive first stacked lower contact layer.
Figure 5:
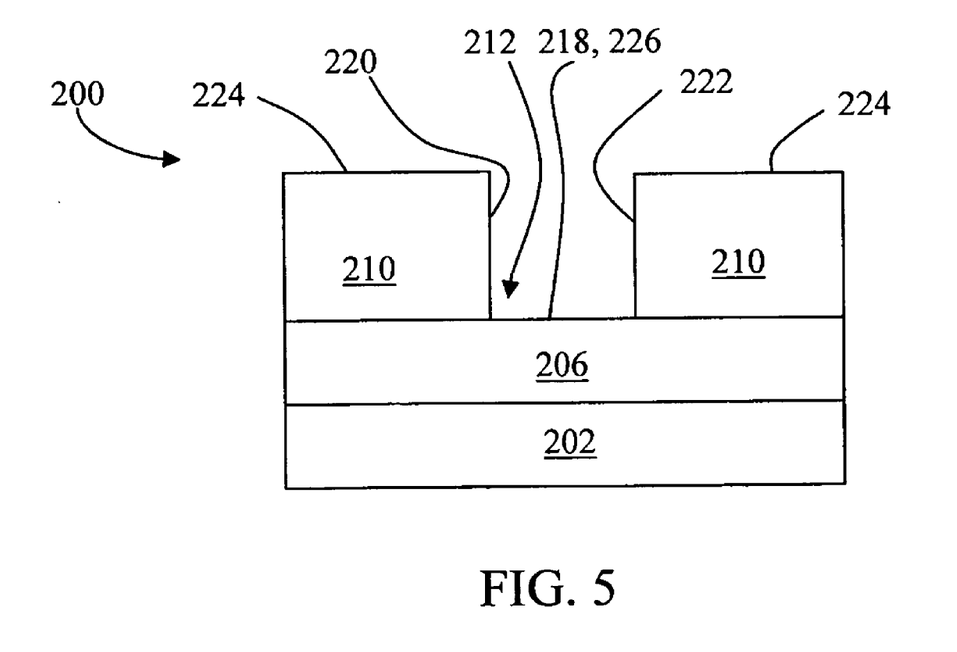
FIG. 5 is a schematic depiction of the electronic device illustrated in FIG. 4 having a lithographically formed opening within the insulative layer.

FIG. 4 shows cross sectional views of the lower portion of composite structure 200 at an intermediate stage of processing. The bottom electrode layer 206 is formed on a substrate 202, and the insulative layer 210 deposited on the bottom electrode layer 206. The opening 212 in insulative layer 210 is formed thereby exposing a portion 218 of the bottom electrode layer 206 as illustrated in FIG. 5. The upper surface 224 of the insulative layer 210, the exposed portion 218 of the bottom electrode 206 and the opening 212 is then filled with an active material layer 214. Further device features may then be formed on top of the active material layer 214 such as a top electrode layer (illustrated as 216 in FIG. 3).

In an embodiment of the instant invention, as illustrated in FIGS. 4-5, the insulative and bottom electrode layers 210, 206, respectively, are formed sequentially over the substrate 202 by conventional physical vapor deposition (PVD, such as sputtering) or chemical vapor deposition (CVD).

The insulative layer 210 formed over the bottom electrode layer 206 electrically insulates the device features that will be subsequently formed. The insulative layer 210 may comprise an oxide such as silicon oxide, silicon nitride, or other dielectric materials.

Openings 212 are formed having a predefined depth, width, and shape. Representative openings include pores, vias, trenches, holes, or channels. The openings may be formed in the insulative layer 210 by patterning or masking the insulative layer 210 using e-beam lithography or photolithography and etching (e.g. wet chemical etch, dry etch, reactive ion etching) to form an opening 212 of each device in an array of devices formed on substrate 202 and thereby expose selected portions 218 of the bottom electrode layer 206, as illustrated in FIG. 5.

Figure 6:
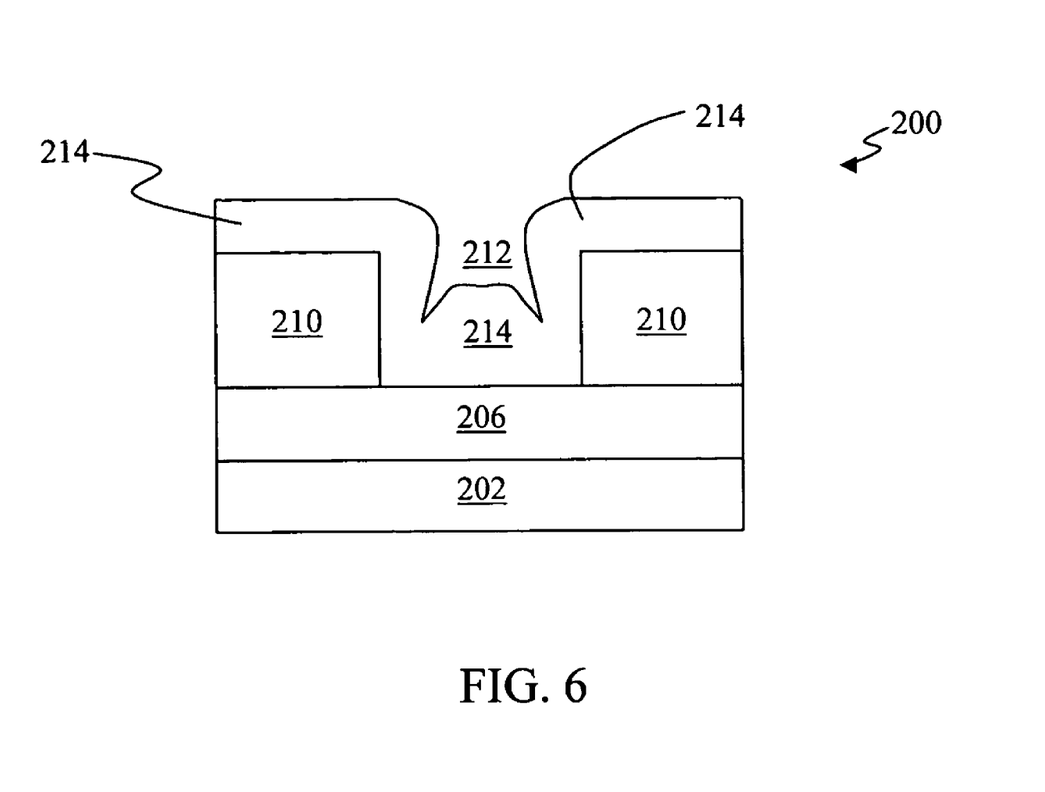
FIG. 6 illustrates a partial cross-sectional view of an electronic device with an active material layer deposited via a standard deposition process on the electronic device illustrated in FIG. 5.

Each opening 212 may be initially filled using a standard deposition process, as illustrated in FIG. 6, to cover a portion of, or the entire opening 212.

The insulative layer 210 and the selectively exposed portions 218 of the bottom electrode layer 206 cooperate to define the dimensions of the opening 212, wherein vertically oriented portions of the insulative layer 210 form sidewalls 220, 222 of the opening 212 extending from an upper surface 224 of the insulative layer 210 to the selectively exposed portion 218 of the bottom electrode layer 206, and wherein a horizontally oriented selectively exposed portion 218 of the bottom electrode layer 206 forms a bottom 226 of the opening 212.

In an embodiment of the invention, the width or lateral dimension of the opening 212 is at the lithographic limit. In another embodiment, the width or lateral dimension of the opening 212 is sublithographic. The lithographic limit is a feature size or physical dimension limit imposed by photolithographic processing capabilities normally attributable to a limit on the ability to reduce the wavelength of the light or electron beam source used to pattern or segment features during processing. According to the current technology roadmap, the feature size limit for flash technology is 65 nm (NOR)/57 nm (NAND). As processing techniques improve, the feature size limit will decrease in the future to further the goal of miniaturization. The projected feature size limit is 45 nm (NOR)/40 nm (NAND) in 2010 and 32 nm (NOR)/28 nm (NAND) in 2013. The methods described herein for forming conformal and uniform active material layers will scale with equal efficacy as the feature size limit decreases in the future.

In one embodiment, the width or lateral dimension of the opening 212 is generally the physical dimension of the opening in a direction parallel to the substrate 202. In FIG. 5, for example, the width or lateral dimension is the distance between sidewall 220 and sidewall 222. When the shape of the opening is round, the lateral dimension may be the diameter or the equivalent thereof of the opening.

The aspect ratio of the opening 212 may be defined as the ratio of the height or normal dimension of the opening to the width or lateral dimension of the opening. The height or normal dimension of the opening 212 is generally the physical dimension of the opening perpendicular to the substrate 202. In FIG. 5, for example, the height or normal dimension of the opening 212 corresponds to the thickness of insulative layer 210.

In one embodiment of the instant invention, the height or normal dimension of the opening 212 is at least equal to or greater than the width or lateral dimension of the opening 212. The instant invention applies to any opening formed within a electronic device with an aspect ratio >0.25:1. In one embodiment, the instant invention applies to openings with an aspect ratio greater than 1:1. In another embodiment, the instant invention applies to openings having an aspect ratio of at least 3:1. In still another embodiment, the instant invention applies to openings having an aspect ratio of at least 5:1.

It is to be understood that the width or lateral dimensions, height or normal dimensions, and aspect ratios of the opening 212 as disclosed herein are illustrative only and are not intended to limit the scope of the opening's dimensions, wherein the dimensions of the opening 212 may vary from the dimensions disclosed herein as required by the device structure.

The active material layer 214 as illustrated in FIG. 6 may be deposited upon the bottom electrode layer 206 as well as upon the top and sidewall surfaces of insulative layer 210. The active material layer 214 may include any phase change material, chalcogenide material, programmable resistance material, threshold switching material, or a combination thereof.

As used herein, active material refers generally to an electrically stimulable material such as a programmable resistance material or an electrical switching material. A programmable resistance material is a material having two or more states that are distinguishable on the basis of electrical resistance. The two or more states may be structural states, chemical states, electrical states, optical states, magnetic states, or a combination thereof. A programmable resistance material is transformable ("programmable") between any pair of states by supplying an appropriate amount of energy to the material. The supplied energy may be referred to as a "programming energy". When transformed ("programmed") to a particular state, the programmable resistance material remains in that state until additional energy is supplied to the material. The different states of a programmable resistance material are stable in the absence of external energy and persist for an appreciable amount of time upon removal of the source of programming energy. Programmable resistance materials include phase-change materials, chalcogenide materials, pnictide materials, and other multi-resistance state materials.

Phase change materials include materials that are transformable between two or more crystallographically-distinct structural states. The states may differ in crystal structure, unit cell geometry, unit cell dimensions, degree of disorder, particle size, grain size, or composition. Chalcogenide materials are materials that include an element from Column VI of the periodic table as a significant or predominant component along with one or more modifying elements from Columns III, IV, or V of the periodic table. Pnictide materials are materials that include an element from Column V of the periodic table as a significant component along with one or more modifying elements from Columns III, IV, or VI of the periodic table. Other multi-resistance state materials include metal-insulator-metal structures with thin film insulators. Programmable resistance materials may serve as the active material in memory devices, including non-volatile memory devices. Representative programmable resistance materials in accordance with the instant invention are described in U.S. Pat. Nos. 6,967,344; 6,969,867; 7,020,006; and references cited therein; all of which disclosures are incorporated by reference herein.

Chalcogenide materials are an embodiment of phase change materials in accordance with the instant invention. Chalcogenide materials have been previously utilized in data processing, optical, electrical material and switching applications and some representative compositions and properties have been discussed in U.S. Pat. Nos. 5,543,737; 5,694,146; 5,757,446; 5,166,758; 5,296,716; 5,534,711; 5,536,947; 5,596,522; 6,087,674; and 7,186,998; the disclosures of which are hereby incorporated in their entireties by reference herein, as well as in several journal articles including "Reversible Electrical Switching Phenomena in Disordered Structures", Physical Review Letters, vol. 21, p. 1450 1453 (1968) by S. R. Ovshinsky "Amorphous Semiconductors for Switching, Material, and Imaging Applications", IEEE Transactions on Electron Devices, vol. ED-20, p. 91 105 (1973) by S. R. Ovshinsky and H. Fritzsche; the disclosures of which are hereby incorporated by reference herein.

Electrical switching materials are materials that are switchable between two states that differ in electrical conductivity. The two states range in conductivity from the relatively resistive (e.g. comparable to a dielectric) to the relatively conductive (e.g. comparable to a metal). Electrical switching materials generally have a quiescent or relaxed state, usually a relatively resistive state, in which they exist in the absence of electrical energy. When electrical energy is applied, the switching material transforms to a more conductive state and persists in that state transitorily for so long as it is subjected to a critical amount of energy from an external source. When the external energy decreases below the critical level, the switching material relaxes back to its quiescent state. Switching materials include OTS (Ovonic Threshold Switch) materials, negative differential resistance materials, and metal-insulator-metal structures. Certain chalcogenide and pnictide compositions also exhibit electrical switching. Illustrative switching materials include those described in U.S. Pat. Nos. 6,967,344 and 6,969,867 incorporated by reference hereinabove.

In one embodiment of the invention illustrated in FIG. 6, the upper surface 224 of the insulative layer 210 and the opening 212 may be filled with active materials such as a programmable resistance material, an electronic switching material, a chalcogenide material such as (GST) $Ge_2Sb_2Te_5$, a GST alloy, a phase-change material, or a pnictide material.

The composition of the active material must be selected to ensure proper melting, flow, and prevention of undue chemical reaction of the active material layer with the bottom electrode layer 206.

The active material layer 214 should not react with conducting bottom electrode when surface mobility in the active material increases due to elevated pressure or temperature or a combination of both. The melting temperature of the active material layer 214 may be less than the melting temperature of the bottom electrode layer 206. The type of active material used to form the active material layer 214 may vary depending upon the type of conducting material used to form bottom electrode layer 206.

In one embodiment, the bottom electrode layer 206 forms a bottom conductive line such as a word or a bitline that may be connected to an external power supply to provide energy to device structure 200.

In an embodiment of the instant invention, the materials used to form the bottom electrode layer 206 may include TiAlN, TiSiN, TaN, MoN, TiN, C, or a combination thereof.

In one embodiment of the instant invention, the bottom electrode layer 206 is formed of materials such as Ti, TiW, or combinations thereof. The bottom electrode layer 206 may include materials with resistive properties, such as TiN, TiSiN, TiAlN, tungsten (W), or molybdenum.

In an embodiment of the instant invention, the bottom electrode layer 206 may be formed with materials such as refractory metals, which are a class of metals extraordinarily resistant to heat, wear, and corrosion. The refractory metals may include tungsten (W), molybdenum (Mo), niobium (Nb), tantalum (Ta), Cobalt (Co), Nickel (Ni), or rhenium (Re).

Figure 6A:
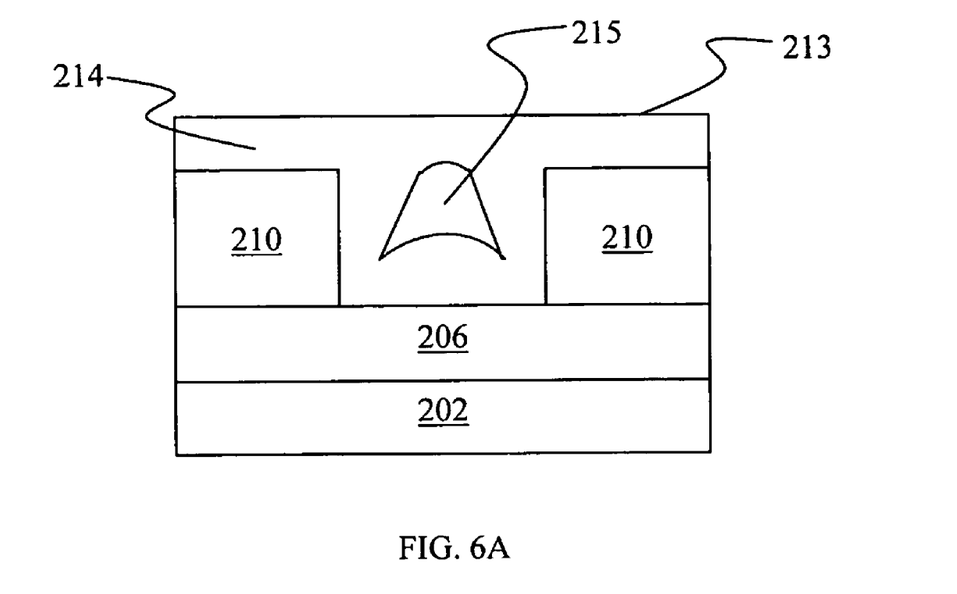
FIG. 6A illustrates an electronic device in an intermediate state of fabrication with an active material layer exhibiting a "keyhole" structure.
Figure 6B:
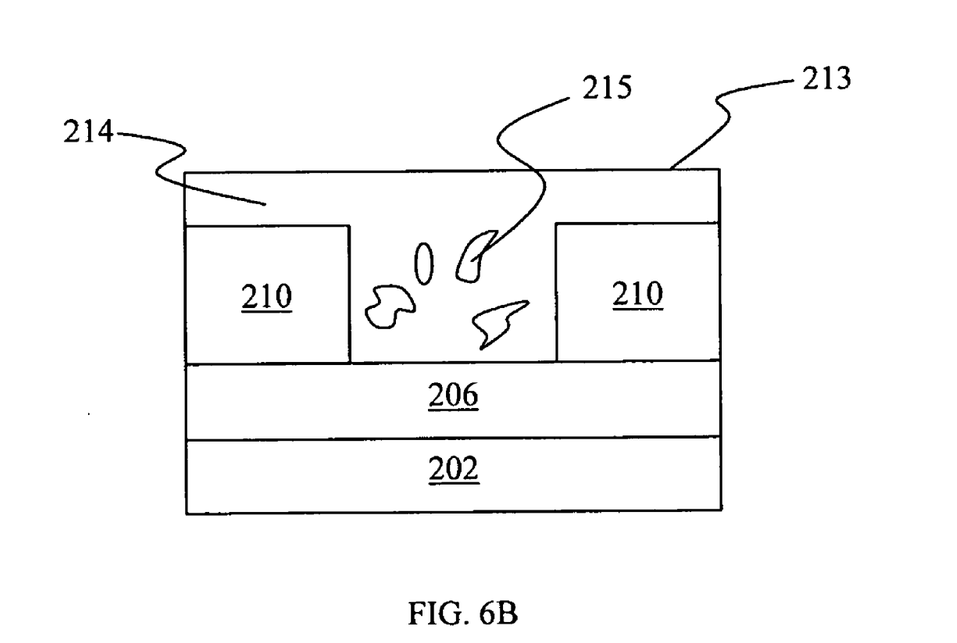
FIG. 6B illustrates an electronic device in an intermediate state of fabrication with an active material layer exhibiting a multiple void structure.

In an embodiment of the invention illustrated in FIG. 5, once the exposed portion 218 of the bottom electrode layer 206 is formed, the active material layer 214 is then deposited initially using a non-conformal deposition process such as physical vapor deposition, sputtering. The active material is deposited over the insulative layer 210, opening sidewalls 220, 222, and the exposed portion 218 of the bottom electrode layer 206. When a non-conformal deposition technique is used, filling of opening 212 becomes increasingly non-uniform and incomplete as the aspect ratio increases. In FIG. 6, for example, the thickness of active material layer 214 along sidewalls 220 and 222 varies in the direction normal to substrate 202. The greater thickness toward the upper surface 224 of insulative layer 210 occludes the internal unfilled portion of opening 212 and inhibits continuous, dense filling of opening 212. If the non-conformal deposition of active material layer 214 is continued beyond the state indicated in FIG. 6, an incompletely filled opening 212 may result. FIG. 6A, for example, illustrates a so-called "keyhole" structure that arises when the interior portion of opening 212 is fully occluded because of the variable thickness of active material layer 214. In the keyhole structure, active material layer 214 is continuous at its upper surface 213, but void 215 (an unfilled region) remains. In addition to keyhole structures, other structures with non-completely-filled openings 212 may form. Such structures may include a plurality of voids, which may be distributed uniformly or non-uniformly within opening 212. FIG. 6B shows one example of a structure having a plurality of voids 215.

The active material layer is typically deposited by a chemical vapor deposition (CVD) or a sputtering process well known in the art. Complete fill of openings is not critical in the initial deposition in the context of the instant invention because large voids can be ameliorated as described more fully hereinbelow.

The deposition temperature, pressure, and gas flows may be adjusted to tune the process for optimal annealing or deposition rate of the materials during CVD or sputter deposition, or minimized particulate formation during CVD or sputtering deposition. Although conformal deposition is helpful, it is not necessary because filling the voids is not a requirement at this step in the process according to the instant invention.

After the active material layer has initially been deposited on the insulative layer 210, within the opening 212, and on selected exposed portions of the bottom electrode 206, elevated temperature and pressure may be used to increase the surface mobility of the active material.

In an embodiment of the instant invention, the use of temperature and/or pressure causes high surface mobility of the active material such as GST alloys. The increased mobility and reduced viscosity of the active material allows the active material to fill openings which otherwise would have poor or non-uniform coverage after a standard deposition process, thereby completely filling the openings 212. Voids, such as voids 215 shown in FIG. 6A and FIG. 6B, become filled through flow of active material 214 while in a higher mobility or less viscous state induced by heating and/or through flow of active material 214 induced by mechanical force. When the thin deposited active material layer 214 is heated at or near the active material's melting temperature, surface tension facilitates coalescence of active material 214 within openings, including high aspect ratio openings, and voids.

In an embodiment of the instant invention, once the active material layer is initially formed by standard deposition, the device 200 is annealed near, at or just above the melting temperature of the active material used to cover the insulative layer 210 to fill the opening 212. The annealing step causes active material forming the active material layer 214 to melt or to become less viscous, and surface tension causes the molten layer to relax and flow down into any voids in the opening 212.

Heating of the active material may be either direct or indirect, wherein the whole wafer is heated.

The annealing step is conducted somewhat below, at, or just above the melting temperature of the active material layer 214. Excess temperatures increase the likelihood of interdiffusion, alloying, sublimation, or reaction of the active material layer with any of the surrounding materials, potentially causing shorting within the device or impaired performance or cycle life. Therefore, the heating proceeds somewhat below, at, or just above the active material layer melting temperatures to sufficiently reduce the viscosity and increase the surface mobility of the active material layer to promote dense filling of the opening or voids while avoiding deleterious interactions between the active material layer and the surrounding materials. For this reason, the temperature at which the active material layer is heated is preferably below the melting temperature of the surrounding materials, such as the bottom electrode. Additionally, the temperature should not be high enough to cause disassociation or decomposition of the active material layer itself.

In an embodiment of the instant invention where the active material layer 214 is formed from a chalcogenide alloy, the temperature should be within a 400° C. to 600° C. range to soften the active material. In another embodiment, the temperature should be within a 450° C. to 550° C. range to soften the active material.

The cooling rate of the active material should be such that does not change the structure or stress the active material.

Depending on the subsequent thermal cycling of the electronic device, the composition of the active material (and thus, the melting temperature) is optimized to ensure that the active material layer 214 remains stable throughout the processing sequence.

In an embodiment of the instant invention, elevated pressure may be used to assist the flow of the active material and to counter the vapor pressure produced from the active material layer 214 when elevated to temperatures somewhat below, at, or just above the melting temperature of the active material layer 214.

In order not to lose active material within the active material layer 214 due to the active material's vapor pressure at elevated temperatures, the pressure within a processing chamber may be raised to suppress evaporation of the active material. Evaporation of the active material is undesirable because different elements within the active material composition may vaporize to differing degrees at the heating temperature. Differential elemental evaporation may alter the composition of the non-evaporated portion of the active material layer and accordingly may alter the performance characteristics of the device.

In an embodiment of the instant invention, elevated pressure may be applied to the device using gases within a processing chamber or using mechanical pressure.

In an embodiment of the instant invention, vacuum pressure or a pressure differential may be used to apply elevated pressure to the device 200.

Figure 9:
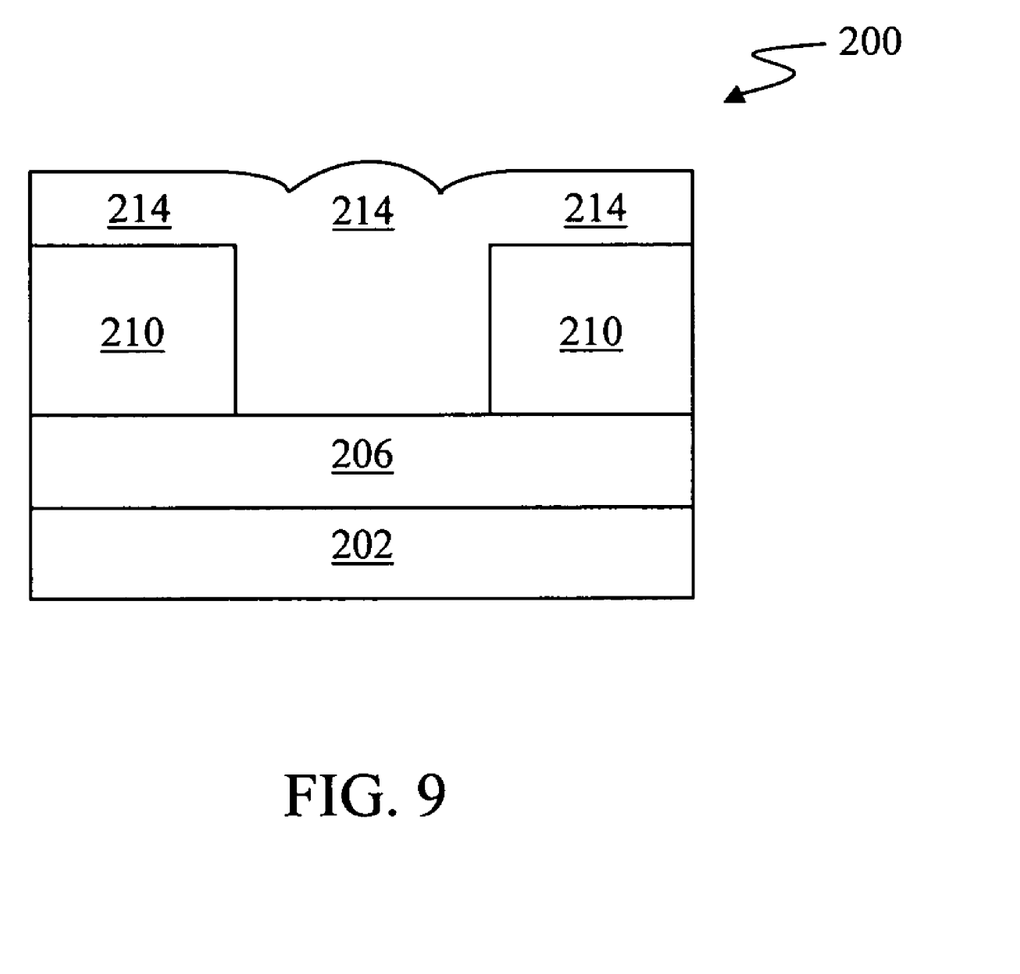
FIG. 9 is a schematic depiction of coverage of the active material layer on the insulative layer and within the opening illustrated in FIG. 6 using temperature and control methods in accordance with embodiments of the instant invention.

FIG. 9 depicts a schematic of the completed filling of an opening with active layer 214 using elevated temperature and a selected pressure. The active material within the active material layer 214 moves from the surface of insulative layer 210 into the opening 212 due to higher surface mobility, reduced viscosity and surface tension. The thickness of the active material layer 214 becomes thinner than the thickness of the active material layer initially deposited on the device 200, at least in regions near the opening, as illustrated in FIG. 9, when the opening 212 fills with the active material. However, variations in thickness may be removed using a CMP or RIE process as illustrated in FIG. 3. Once opening 212 is filled, a CMP or RIE process may also be used to remove the portion of active layer 214 remaining above the top surface of insulative layer 210.

In an embodiment of the invention, the device is placed on a general mount having a flat stable surface within a processing chamber. An optically flat surface such as a silicon wafer or a ram of a hydraulic press large enough to cover the upper surface 232 of the active material layer 214 is heated and applied as mechanical pressure to the device 200, thereby compressing the device 200 against the mount.

In an embodiment of the invention, the active material layer 214 has a preferential affinity for the surface upon which it is deposited relative to the surface of the wafer or ram used to force the active material layer into the opening 212. The preferential affinity is advantageous because it reduces the likelihood that the integrity of active material layer 214 is disturbed when the contacting wafer or ram is removed.

In an embodiment of the instant invention, the filling process may also be carried out under elevated pressure to facilitate packing of the active material into the opening. In addition to preventing evaporation, the optically flat material serves as protective cover for the active material so that the material extrudes into the void and does not exit the electronic device structure 200. Mechanical pressure produced by applying a force to drive the active material 214 into opening 212 to fill voids may be accomplished at ambient or elevated temperatures.

The optically flat surface applied to the active material layer retards evaporation or sublimation of the active material surface due to an increase in its vapor pressure upon heating to a temperature somewhat below, at, or above the active material layer melting temperature.

In an embodiment of the instant invention, the thickness of the deposited active material layer 214 is selected such that when mechanical pressure from the optically flat surface is applied and the temperature of the device 200 or the active material layer 214 is elevated enough active material is available to flow down into the opening 212 to completely fill the opening 212.

In one embodiment of the invention, heat is applied to the active material layer of the device structure 200 before compressing the optically flat surface against the active material layer 214. Once the active layer has cooled, the pressure can be removed.

Figure 7:
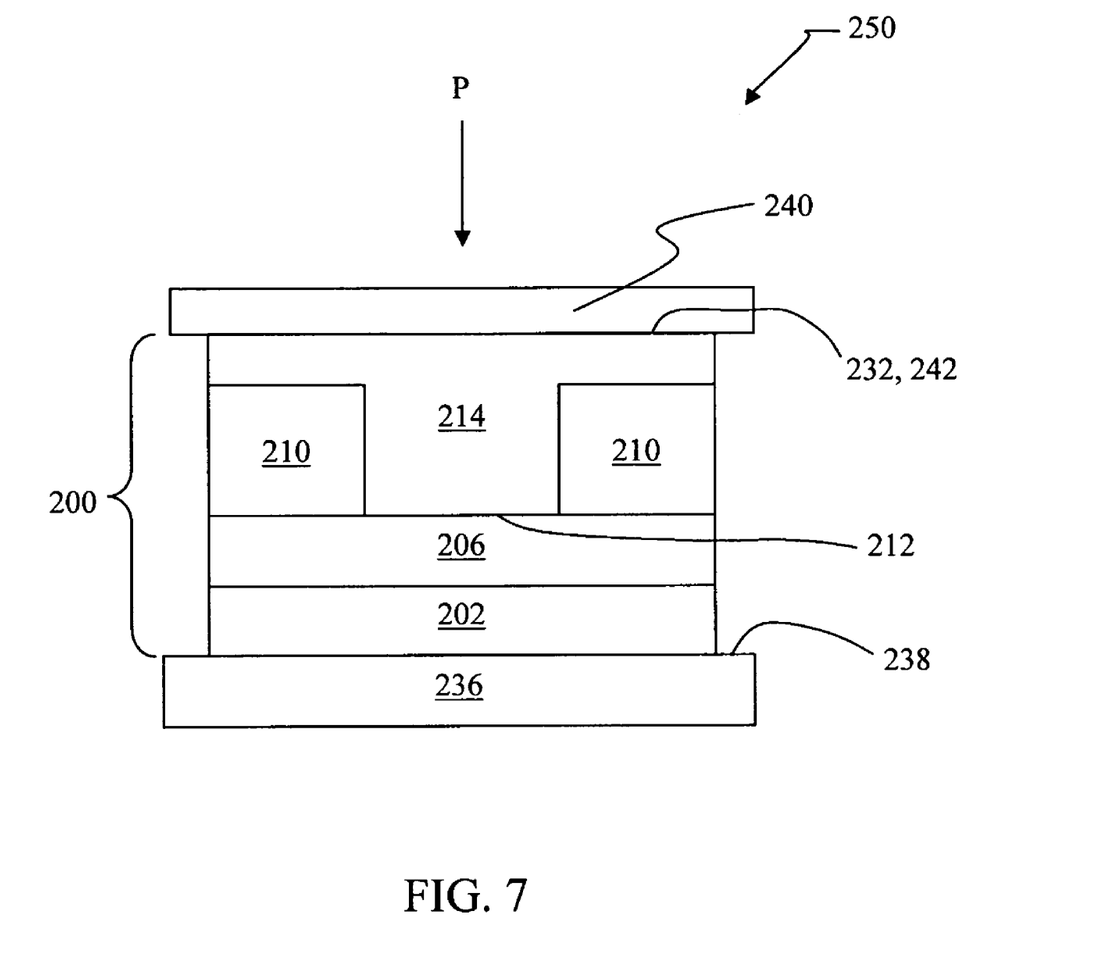
FIG. 7 is a schematic depiction of a wafer compression device that uses temperature and pressure control methods to increase surface mobilities in an active material layer of the electronic device illustrated in FIG. 6.

In an embodiment of the invention illustrated in FIG. 7, the optically flat surface used to apply mechanical pressure may be defined as a lower surface 242 of a wafer 240 of either single crystal silicon, amorphous silicon, or polycrystalline silicon. The optically flat surface is applied to the upper surface 232 of the active material layer 214 as illustrated in FIG. 7.

In another embodiment of the instant invention, a process of uniformly forming the active material layer 214 may be carried out under vacuum or in an inert gas atmosphere and at a lower temperature, in which case mechanical pressure applied to the device 200 is not needed. Use of temperature and pressure to promote complete filling of the opening 212 with active material layer 214 may occur in combination or separately.

Figure 8:
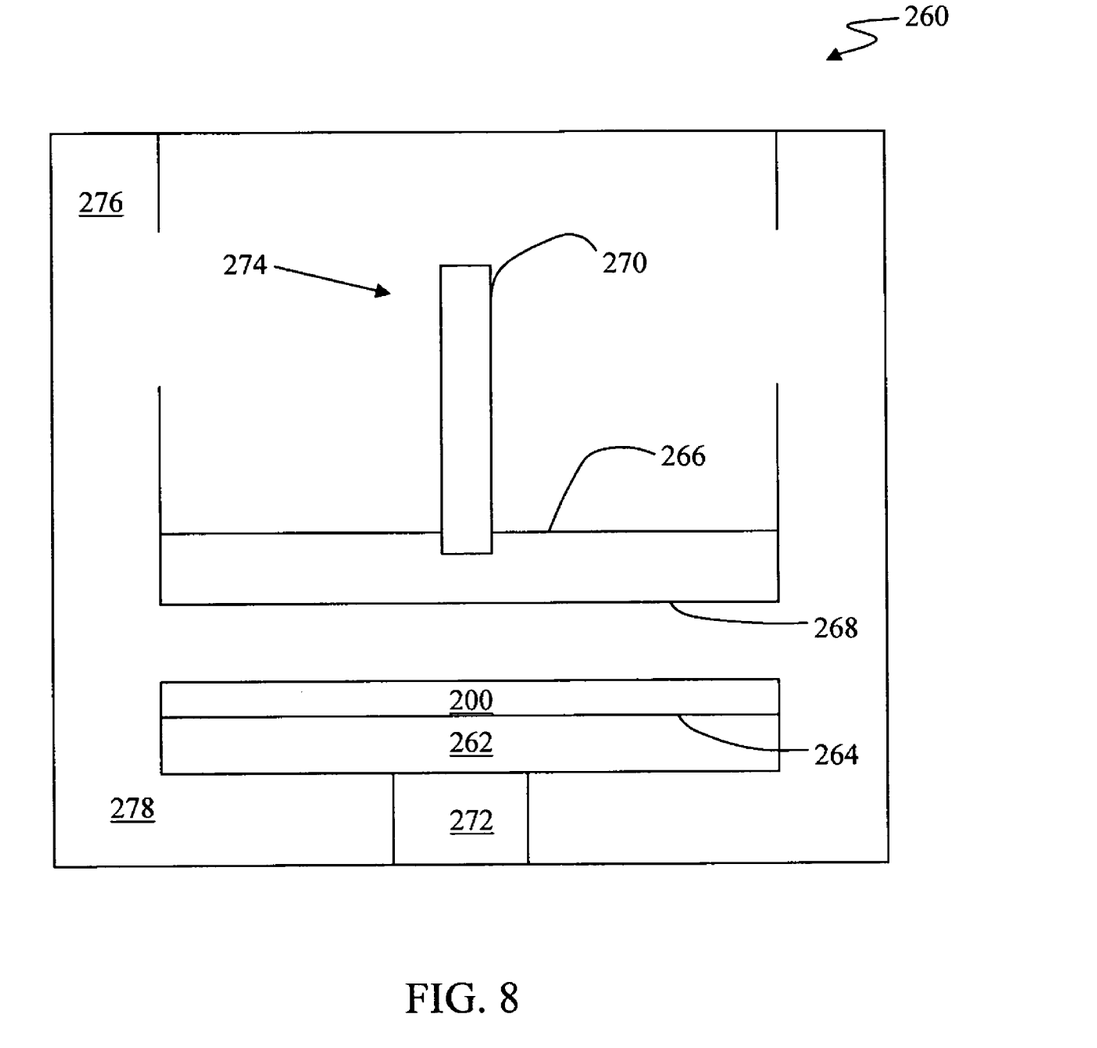
FIG. 8 is a schematic depiction of a hydraulic press within a process chamber that uses temperature and pressure control methods used to increase surface mobilities in an active material layer of the electronic device illustrated in FIG. 6.

In an embodiment of the instant invention the device 200 is placed in a processing chamber as shown in FIG. 8 (not shown in FIG. 7). Referring now to FIG. 7, a pressure differential may be applied to the device 200 to bias the active material layer 214 to fill the opening 214 and the temperature may be elevated to a temperature somewhat below, at, or above the active material layer 214 melting temperature but below the melting temperature of the surrounding materials when the pressure differential is formed and when the wafer 240 compresses the device 200 towards the mount 236.

In an embodiment of the invention, to form the pressure differential, high pressure or mechanical force may be applied to an upper surface of wafer 240 whereupon the wafer lower surface 242 compresses active material layer 214 upper surface 232, and low pressure may be applied to a lower surface 236 of the substrate layer 202 of the electronic device 200, thereby biasing the active material layer 214 to fill opening 212.

In another embodiment of the invention, to form the pressure differential, the portion of the chamber above the wafer 240 is pressurized above atmospheric pressure, thereby biasing the active material layer 214 to fill opening 212 through motion of wafer 240.

Inert gases such as Ar, He, or $N_2$ may be used as gases in the pressurizing process as applied to the device 200. Once the opening filling process is complete, the pressure within the chamber may then be returned to atmospheric pressure. Additionally, a temperature well below the melting temperature of the active material may be provided to prevent unwanted reaction of the active material with surrounding materials during the extrusion process.

In an embodiment of the invention, once the opening 212 has been filled, removal of the wafer 240 from the device 200 is done in a manner to minimize further structural irregularities in the active material layer 214. As the viscosity of the active material increases, it is more likely that lifting of the wafer 240 away from the device 200, as opposed to sliding the wafer 240 in a lateral direction away from the device 200 will damage (or cause peeling of) the active material layer by peeling off of a portion of the active material layer on to the lower surface 242 of the wafer 240.

In an embodiment of the instant invention, the wafer 240 may be removed by sliding the wafer 240 with respect to the device 200 in a lateral direction instead of direct lifting of the wafer 240 to prevent displacement of the active material from the surface feature.

Thus, the wafer 240 may be removed by laterally sliding the wafer with respect to the electronic device to prevent structural defects or additional voids from forming within the opening 212 upon conclusion of the filling process.

However even if the upper active material surface 232 is damaged, the surface feature, e.g. opening 212, being filled is generally going to be overfilled so the upper surface 232 of the active material layer 214 will subsequently be removed in, for example, a subsequent CMP processing step.

In an embodiment of the invention as illustrated in FIG. 8, the optically flat surface may be defined as a lower surface 268 of a ram or platen 266 of a hydraulic press, wherein the platen 266 may be a wafer chuck. The wafer chuck may be a conventional chuck well known in the art including a Bernoulli chuck, an electrostatic chuck, a radially heated chuck, a mechanical clamping chuck, and rapid temperature response wafer chuck. Representative wafer chucks in accordance with the instant invention are described in U.S. SIR No. H1145 and U.S. Pat. Nos. 4,709,655; 5,370,709; 5,671,119, 6,080,272; and references cited therein; all of which disclosures are incorporated by reference herein.

As illustrated in FIG. 8, a hydraulic press 274 is placed within a processing chamber 276 to both elevate the temperature of the device 200 and to apply mechanical pressure to the device thereby increasing surface mobility in the active material layer 214 to completely fill the opening 212. The hydraulic press 274 is defined by a hydraulic cylinder or push rod 270 in mechanical engagement with an adjacent heated ram 266 having a lower optically flat surface 268 adapted to contact the device 200. The chuck 262 is capable of being heated to temperatures ranging between 50° C. to 500° C.

In accordance with an embodiment of the invention, the device 200 having the active material layer 214 initially deposited thereon is placed onto the top of chuck upper surface 264, wherein the chuck is supported by pedestal 272. Both heat and pressure are applied to the ram 266 and are thereby transferred to the device 200, thus, forcing material from the active material layer 214 into the opening 212. The temperatures and pressures applied may be varied to achieve desired results.

In an embodiment of the invention, the temperature of the wafer or ram used for compression is higher than the temperature of the chuck 262 and of the lower layers of the electronic device on which the active material is deposited. A higher local viscosity of the active material adjacent to the ram 266 and a lower local viscosity of the active material adjacent lower device layers and to the chuck 262 produces a biasing of the active material toward the chuck 262 to fill the openings 212 and to eliminate adherence to the optically flat surface 268.

Overfilling of the opening may also occur and the excess material may be removed in a subsequent planarization or chemical-mechanical processing step.

FIG. 9 illustrates an overfilling of the opening 212 using temperature and pressure as disclosed in accordance to the several embodiments described herein. Referring now to 9, there is illustrated a schematic cross section of the resulting void-free active material layer 214 filling the straight opening 212 using temperature and pressure as disclosed herein. The active material layer is a conformal layer completely filling opening 212 and is free of any voids or seams (except for local grain boundaries). The active material layer is slightly reduced in thickness, as illustrated in FIG. 9, at least in local proximity to the opening, over the original upper surface 232 of the active material layer due to movement of material into the opening 212 to fill the void. This reduced thickness is not significant, however, because the irregular upper active material layer will normally be smoothed or removed in a subsequent processing step.

After conformal forming of the active material layer 214 and complete filling of the opening 212, the upper surface 232 of the active material layer 124 may then be smoothed by a standard process such as planarizing, polishing or etching.

Any conventional processing technique such as CMP or RIE can be used to remove the unnecessary material after the extrusion-flow process.

After the planarization process, the balance of the device 200 may be formed including sequential formation of a top electrode layer 216, which are each fabricated by conventional deposition techniques (e.g. sputtering or chemical vapor deposition).

As illustrated in FIG. 3, the balance of the device 200 may be formed including the top electrode layer 216 over the active material layer 214. Filling the opening 212 within the insulative layer 210 with active material 214 operates to densely pack the active material within the opening and thereby reduce structural irregularities within the opening.

The active material layer in the final structure is stable during subsequent thermal processing as long as the processing temperature does not exceed the melting temperature of the active material layer.

The results have illustrated that with proper materials and use of temperature and pressure control methods, uniform coverage of the insulative layer with the active material layer and complete filling of the active material within the opening reduces structural irregularities within the opening thereby increasing material density, reducing thickness variations in the active material layer, reducing device shunting and early failure of the device, and improving device characteristics.

The disclosure and discussion set forth herein is illustrative and not intended to limit the practice of the instant invention. While there have been described what are believed to be the preferred embodiments of the instant invention, those skilled in the art will recognize that other and further changes and modifications may be made thereto without departing from the spirit of the invention, and it is intended to claim all such changes and modifications that fall within the full scope of the invention. It is the following claims, including all equivalents, in combination with the foregoing disclosure and knowledge commonly available to persons of skill in the art, which define the scope of the instant invention.

We claim:

1. A method of forming an electronic device comprising:
   forming an active material over an insulative layer having an opening defined therein; and
   mobilizing said formed active material, said mobilizing including contacting said active material with a heated ram and applying mechanical force.

2. The method of claim 1, wherein the depth of said opening is equal to the thickness of said insulative layer.

3. The method of claim 2, wherein said insulating layer is formed over a conductive layer, said opening exposing a top surface of said conductive layer.

4. The method of claim 3, wherein said active material contacts said exposed portion of said conductive layer.

5. The method of claim 1, wherein said active material is selected from the group consisting of programmable resistance materials, electronic switching materials, chalcogenide materials, phase-change materials, and pnictide materials.

6. The method of claim 5, wherein said active material comprises Te and Ge.

7. The method of claim 1, wherein said active material partially occupies said opening.

8. The method of claim 7, wherein said mobilizing increases the amount of said active material in said opening.

9. The method of claim 1, wherein said active material non-conformally contacts said insulative layer and a sidewall of said opening.

10. The method of claim 9, wherein said non-conformal active material includes one or more voids, at least one of said one or more voids occupying said opening.

11. The method of claim 10, wherein said mobilizing reduces the volume of said one or more voids occupying said opening.

12. The method of claim 11, wherein said mobilizing causes said active material to completely fill said opening.

13. The method of claim 12, wherein said opening has an aspect ratio of at least 0.25:1.

14. The method of claim 12, wherein said opening has an aspect ratio of at least 1:1.

15. The method of claim 12, wherein said opening has an aspect ratio of at least 3:1.

16. The method of claim 1, wherein the contacting surface of said heated ram is optically flat.

17. The method of claim 1, wherein the temperature of said heated ram is within 100° C. of the melting temperature of said active material.

18. The method of claim 1, wherein said application of mechanical force increases the amount of said active material in said opening.

19. The method of claim 1, further comprising heating said active material.

* * * * *